United States Patent
Gupta et al.

(10) Patent No.: US 11,842,758 B2
(45) Date of Patent: Dec. 12, 2023

(54) MEMORY CELL INCLUDING A SPIN-ORBIT-TORQUE (SOT) LAYER AND MAGNETIC TUNNEL JUNCTION (MTJ) LAYER STACKS AND WRITING METHOD THEREFOR

(71) Applicants: IMEC VZW, Leuven (BE); Katholieke Universiteit Leuven KU LEUVEN R&D, Leuven (BE)

(72) Inventors: Mohit Gupta, Leuven (BE); Kevin Garello, Leuven (BE); Manu Komalan Perumkunnil, Leuven (BE)

(73) Assignees: IMEC VZW, Leuven (BE); KATHOLIEKE UNIVERSITEIT LEUVEN, Leuven (BE)

( * ) Notice: Subject to any disclaimer, the term of this patent is extended or adjusted under 35 U.S.C. 154(b) by 101 days.

(21) Appl. No.: 17/546,553

(22) Filed: Dec. 9, 2021

(65) Prior Publication Data
US 2022/0189523 A1 Jun. 16, 2022

(30) Foreign Application Priority Data
Dec. 11, 2020 (EP) .................................. 20213426

(51) Int. Cl.
*G11C 11/16* (2006.01)
(52) U.S. Cl.
CPC ...... *G11C 11/1673* (2013.01); *G11C 11/1655* (2013.01); *G11C 11/1657* (2013.01); *G11C 11/1675* (2013.01)
(58) Field of Classification Search
None
See application file for complete search history.

(56) References Cited

U.S. PATENT DOCUMENTS

| 9,660,582 B2 | 5/2017 | Wang et al. |
| 10,102,894 B2 | 10/2018 | Shimomura et al. |
| 10,109,334 B2 | 10/2018 | Yoda et al. |

(Continued)

FOREIGN PATENT DOCUMENTS

WO WO-2008100873 A2 8/2008

OTHER PUBLICATIONS

Y. Kim, X. Fong, K. -W. Kwon, M. -C. Chen and K. Roy, "Multilevel Spin-Orbit Torque MRAMs," in IEEE Transactions on Electron Devices, vol. 62, No. 2, pp. 561-568, Feb. 2015, doi: 10.1109/TED.2014.2377721.

Yoda, Hiroaki et al. "High-Speed Voltage-Control Spintronics Memory (High-Speed VoCSM)." 2017 IEEE International Memory Workshop (IMW) (2017): 1-4.

K. A. Ahmed, L. Fei, S. Y. Lua and C. Heng, "Area Efficient Multi-Level Cell SOT-MRAM with Shared Diode for High Density Memories Applications.," 2018 IEEE International Magnetics Conference (INTERMAG), 2018, pp. 1-2, doi: 10.1109/INTMAG.2018.8508418.

(Continued)

*Primary Examiner* — J. H. Hur
(74) *Attorney, Agent, or Firm* — MOSER TABOADA

(57) ABSTRACT

According to an aspect there is provided a memory cell. The memory cell comprises: a first and a second electrode; a spin-orbit-torque, SOT, layer comprising a first and a second electrode contact portion arranged in contact with the first and the second electrode, respectively, and an intermediate portion between the first and second electrode contact portions; a first magnetic tunnel junction, MTJ, layer stack arranged in contact with the intermediate portion; and a second MTJ layer stack arranged in contact with the second electrode contact portion and directly above the second electrode.

A memory device comprising such a memory cell and a method for writing to such a memory cell are also provided.

10 Claims, 4 Drawing Sheets

(56) References Cited

U.S. PATENT DOCUMENTS

| | | | |
|---|---|---|---|
| 10,147,473 B2 | 12/2018 | Yoda et al. | |
| 10,347,313 B2 | 7/2019 | Shimomura et al. | |
| 10,460,785 B1 | 10/2019 | Lee et al. | |
| 2017/0077177 A1* | 3/2017 | Shimomura | H10B 43/27 |
| 2017/0169872 A1 | 6/2017 | Yoda et al. | |
| 2018/0061482 A1 | 3/2018 | Zhao et al. | |
| 2018/0145691 A1* | 5/2018 | Manipatruni | H03K 19/18 |
| 2018/0151210 A1 | 5/2018 | Li et al. | |
| 2019/0006415 A1 | 1/2019 | Li et al. | |
| 2019/0334080 A1* | 10/2019 | Ahmed | G11C 11/1673 |
| 2020/0005844 A1 | 1/2020 | Alhalabi et al. | |
| 2020/0136018 A1 | 4/2020 | Ying et al. | |

OTHER PUBLICATIONS

K. Ali, F. Li, S. Y. H. Lua and C. Heng, "Area Efficient Shared Diode Multi-Level Cell SOT-MRAM," in IEEE Transactions on Magnetics, vol. 54, No. 11, pp. 1-5, Nov. 2018, Art No. 3401105, doi: 10.1109/TMAG.2018.2848114.

Y. Xu, B. Wu, Z. Wang, Y. Wang, Y. Zhang and W. Zhao, "Write-Efficient STT/SOT Hybrid Triple-Level Cell for High-Density MRAM," in IEEE Transactions on Electron Devices, vol. 67, No. 4, pp. 1460-1465, Apr. 2020, doi: 10.1109/TED.2019.2963421.

* cited by examiner

MEMORY CELL INCLUDING A SPIN-ORBIT-TORQUE (SOT) LAYER AND MAGNETIC TUNNEL JUNCTION (MTJ) LAYER STACKS AND WRITING METHOD THEREFOR

TECHNICAL FIELD

The present inventive concept relates to a memory cell, a memory device, and a method for writing to a memory cell.

BACKGROUND

The magnetic tunnel junction (MTJ) is an enabler for non-volatile memories, e.g. the magnetoresistive random-access memory (MRAM). An MTJ may be switched between two resistance states (e.g. a higher and a lower resistance state) by inducing free layer magnetization reversal. More specifically, the orientation of the free layer magnetization is switched relative to a (fixed) reference layer magnetization, e.g. to be oriented along (a "parallel" state, P) or against the reference layer magnetization (an "anti-parallel" state, AP). By associating either resistive/magnetic state of the MTJ with a respective logic (e.g. "0" and "1") data may accordingly be written to and read from the MTJ.

Current MTJ technology typically relies on spin-transfer-torque (STT) for writing the MTJ ("STT-MTJ"). However alternative techniques are being developed, such as writing the MTJ though spin-orbit-torque (SOT) induced switching of the MTJ ("SOT-MTJ").

In STT-based switching, the state is switched by passing an "STT-switching current" in an out-of-plane direction (e.g. bottom-up or top-down) through the MTJ layer stack. In SOT-based switching, the magnetization state is switched by passing an "SOT-switching current" in an in-plane direction through an SOT-layer arranged above or below the MTJ layer stack. The SOT-layer may be laterally extended outside the footprint of the MTJ layer stack to form a pair of contact portions at mutually opposite sides thereof. The SOT-switching current may thereby be conducted in-plane through the SOT-layer, between a pair of electrodes arranged in contact with the respective contact portions of the SOT-layer.

An SOT-MTJ memory cell may enable faster writing operations than STT-MTJs. On the other hand, an STT-MTJ memory cell may allow for higher memory densities than SOT-MTJs, due to the increased footprint of the SOT-layer relative to the MTJ layer stack. It would however be desirable to provide an MTJ-based memory cell enabling fast writing as well as a high memory density.

SUMMARY

An objective of the present inventive concept is to an MTJ-based memory cell of an improved design, enabling both fast writing and a high memory density. Further and alternative objectives may be understood from the following.

According to a first aspect of the present inventive concept, there is provided a memory cell. The memory cell comprises a first and a second electrode. The memory cell further comprises an SOT layer comprising a first electrode contact portion and a second electrode contact portion arranged in contact with, i.e. in abutment with, the first electrode and the second electrode, respectively, and further comprising an intermediate portion between the first electrode contact portion and the second electrode contact portion. The memory cell further comprises a first MTJ layer stack arranged in contact with the intermediate portion. The memory cell further comprises a second MTJ layer stack arranged in contact with the first electrode contact portion or the second electrode contact portion.

According to the inventive memory cell, the space needed for the lateral extension of the second electrode contact portion, is put to use by accommodating a second MTJ layer stack. Hence, the second MTJ layer stack may be arranged beside the first MTJ layer stack, in contact with the first or second electrode contract portion of the SOT-layer. This enables a doubling of the memory density compared to a memory cell comprising a single MTJ layer stack.

The first MTJ layer stack is arranged in contact with the intermediate portion of the SOT-layer, between the first and second electrode contact portions. This enables SOT-based switching of the first MTJ layer stack. The second MTJ layer stack is arranged in contact with the first or second electrode contact portion, which in turn is arranged in contact with the first or second electrode. Although the location of the second MTJ layer stack along the SOT layer may represent a sub-optimal location for SOT-based switching, STT-based switching may be used for the second MTJ layer stack.

Accordingly, the first MTJ layer stack may be configured to be switchable between two resistance states by applying an SOT switching current to the SOT layer. Meanwhile, the second MTJ layer stack may be configured to be switchable between two resistance states by applying an STT switching current to the second MTJ layer stack.

A hybrid SOT-STT memory cell may hence be provided, combining the advantages of an SOT-MTJ and an STT-MTJ in a same memory cell. SOT-based switching of the first MTJ layer stack may be to support higher speed/higher frequency data writing, while STT-based switching of the second MTJ layer stack may be used to support lower speed/lower frequency data writing.

Due to the different switching mechanisms and locations of the MTJ layer stacks along the SOT-layer, the memory cell enables individual switching/writing of the first and second MTJ layer stacks.

The risk for an STT switching current causing switching of the free layer of the first MTJ layer stack (e.g. if passing in-plane through the intermediate portion SOT layer) is further mitigated by the fact that the current (density) threshold for causing SOT-based switching of an MTJ typically is greater than a corresponding threshold for STT-based switching of the MTJ. Accordingly, the first and second MTJ layer stacks may be configured such that the current (density) threshold for causing SOT-based switching of the first MTJ layer stack exceeds the current (density) threshold for causing STT-based switching of the second MTJ layer stack.

By MTJ layer stack is hereby meant a layer stack comprising an MTJ. An MTJ may comprise a pair of ferromagnetic layers separated by a tunnel barrier layer, thus forming an MTJ. One of the two ferromagnetic layers is configured as the reference or pinned layer with a magnetization with a fixed orientation. The other one of the two ferromagnetic layers is configured as the free layer and has a magnetization which may be varied between two different orientations, along the orientation of the reference layer magnetization (the parallel P state) or against the orientation of the reference layer magnetization (the anti-parallel AP state). The P state may be associated with a low(er) resistance state and the AP state may be associated with a high(er) resistance state wherein the MTJ layer stack (i.e. the MTJ of the MTJ layer stack) may be switched between two resistance states, in other words between two different magnetization states providing a low(er) resistance and a high(er) resistance, respectively.

The MTJ layer stack may further comprise a pinning layer configured to pin the magnetization of the reference layer of the MTJ layer stack. A pinning layer may be a hard-magnetic layer having a high (magnetic) coercivity. The pinning layer may exert a pinning effect on the reference layer such that the magnetization reversal field of the reference layer is increased compared to the free layer of the MTJ layer stack.

By SOT layer (or synonymously "SOT-generating layer") is hereby meant a layer configured to, in response to an SOT switching current, inject a spin current into a free layer adjacent the SOT layer (e.g. the free layer of the first MTJ layer stack), the spin current inducing magnetization reversal in the free layer through SOT. An SOT-layer may be arranged in contact with the adjacent free layer. An SOT-layer may be configured to conduct a current within the plane of extension of the SOT-layer (i.e. the SOT switching current is an in-plane current), and consequently along the associated free layer.

The MTJ layer stacks may be formed/shaped as respective (vertical) pillars, e.g. through patterning.

The SOT layer may be formed as a line, i.e. elongated as seen along a direction between the first and second electrode portions.

According to embodiments, the first and second MTJ layer stacks may be top-pinned and be arranged over the SOT layer, wherein the SOT layer may be arranged over the first and second electrodes.

By a top-pinned MTJ layer stack (or equivalently a top-pinned MTJ of an MTJ layer stack) is hereby meant that the reference layer of the MTJ layer stack is arranged above the free layer of the MTJ layer stack as viewed along a bottom-up-direction of the MTJ layer stack.

The first and second electrodes may accordingly define bottom electrodes of the memory cell, wherein the SOT layer is arranged over the first and second (bottom) electrodes with the first electrode contact portion arranged on top of the first electrode and the second electrode contact portion arranged on top of the second electrode. The first MTJ layer stack may be arranged on top of the intermediate portion of the SOT-layer while the second MTJ layer stack may be arranged on top of the first or second electrode contact portion.

An MTJ layer stack may as mentioned above comprise a pinning layer. In a top-pinned MTJ layer stack the pinning layer is arranged above the reference layer.

According to embodiments the memory cell may further comprise a third MTJ layer stack arranged in contact with the first electrode contact portion or the second electrode portion, wherein the second MTJ layer stack is arranged in contact with the other one of the first or the second electrode contact portion.

Thereby, also the spaces needed for the lateral extension of both the first and second electrode contact portion may be used to accommodate a respective MTJ layer stack. Hence, the third and second MTJ layer stack may be arranged on opposite sides of the first MTJ layer stack, in contact with the respective electrode contract portions of the SOT-layer. This enables a further 50% increase of the memory density compared to a memory cell comprising a two MTJ layer stack.

The third MTJ layer stack may be identical to the second MTJ layer stack.

The third MTJ layer stack may as discussed in connection with the second MTJ layer stack be suitable for STT-based switching.

Accordingly, the third MTJ layer stack may be configured to be switchable between two resistance states by applying an STT switching current to the third MTJ layer stack.

According to a second aspect there is provided a memory device comprising the memory cell according to the first aspect, or any of the afore-mentioned embodiments or variations thereof. The memory device may be configured to:

write to the first MTJ layer stack by supplying an SOT switching current between the first and second electrodes and through the SOT layer such that a resistance state of the first MTJ layer stack is switched; and write to the second MTJ layer stack by supplying an STT switching current through the second MTJ layer stack such that a resistance state of the second MTJ layer stack is switched.

The respective resistance states of the first and the second MTJ layer stack (e.g. lower and higher resistance states) may each be associated with a high or low logic state (e.g. "1" and "0"). A logic state may hence be independently written to the first MTJ layer stack and the second MTJ layer stack.

The memory device may further be configured to: read a logic state from the first MTJ layer stack by sensing a resistance state of the first MTJ layer stack; and read a logic state from the second MTJ layer stack by sensing a resistance state of the second MTJ layer stack. As the MTJ layer stacks are arranged in a side-by-side fashion the resistance states of the MTJ layer stacks may be individually sensed.

According to embodiments, the memory device may further comprise a first through fourth bitline, and the memory cell may further comprise a third and a fourth electrode. The first MTJ layer stack may be arranged between the third electrode and the SOT layer (i.e. the intermediate portion thereof) and the second MTJ layer stack may be arranged between the fourth electrode and the SOT layer (i.e. the first or second electrode contact portions thereof).

The first electrode may be switchably connected to the first bitline. The second electrode may be switchably or fixedly connected to the second bitline. The third electrode may be switchably connected to the third bitline. The fourth electrode may be switchably connected to the fourth bitline.

The memory device may be configured such that:

when writing to the first MTJ layer stack, the fourth electrode is configured to be disconnected from the fourth bitline, and the first and the second electrode are configured to be connected to the first and second bitline, respectively (wherein the SOT switching current may be conducted between the first and second bitline, through the SOT layer); and when writing to the second MTJ layer stack, the third electrode is configured to be disconnected from the third bitline, the fourth electrode is configured to be connected to the fourth bitline, and the first or second electrode is configured to be connected to the respective first or second bitline (wherein the STT switching current may be conducted between the fourth bitline and the first or second bitline, through the second MTJ layer stack, while avoiding current leakage to the third bitline through the first MTJ layer stack).

While conducting the STT switching current is possible between the third electrode and either the first or second electrode, it may be beneficial to conduct the STT switching current the shortest distance possible, as this may reduce heat and current leakage. Accordingly, the second MTJ layer stack may be arranged in contact with the second electrode contact portion wherein the second electrode may be configured to be connected to the second bitline (wherein the STT switching current may be conducted between the fourth bitline and the second bitline). Alternatively, the second MTJ layer stack may be arranged in contact with the first electrode contact portion wherein the first electrode may be configured to be connected to the first bitline (wherein the STT switching current may be conducted between the fourth bitline and the first bitline).

The third electrode may either be configured to be disconnected from the third bitline when writing to the first MTJ layer stack. Current between the SOT layer and the third bitline, via the first MTJ layer stack, may thereby be avoided.

The third electrode may also be configured to be connected to the third bitline when writing to the first MTJ layer stack, such that the SOT switching current conducted between the first and second bitline is supplemented by an STT switching current conducted between the third bitline and either of the first and second bitline. This enables STT-assisted SOT-switching of the first MTJ layer stack. Such an STT-assisted writing may enable a faster and more accurate writing to the first MTJ layer stack The memory device may be configured such that, when reading from the first MTJ layer stack, the third electrode is configured to be connected to the third bitline the first or second electrode is configured to be connected to the respective first or second bitline. The memory device may be configured to sense the resistance state of the first MTJ layer stack via the third bitline and the first or second bitline.

The memory device may be configured such that, when reading from the second MTJ layer stack, the fourth electrode is configured to be connected to the fourth bitline and the first or second electrode is configured to be connected to the respective first or second bitline. The memory device may be configured to sense the resistance state of the second MTJ layer stack via the fourth bitline and the first or second bitline.

According to embodiments wherein the memory cell comprises the third MTJ layer stack arranged in contact with either the first electrode contact portion or the second electrode contact portion, and the second MTJ layer stack is arranged in contact with the other one of the first or second electrode contact portion, the memory device may be configured to write a logic state to the third MTJ layer stack by supplying an STT switching current through the third MTJ layer stack such that a resistance state of the third MTJ layer stack is switched. The memory device may be further configured to read a logic state from the third MTJ layer stack by sensing a resistance state of the third MTJ layer stack.

According to embodiments wherein the memory cell comprises the third MTJ layer stack arranged in contact with either the first electrode contact portion or the second electrode contact portion, and the second MTJ layer stack is arranged in contact with the other one of the first or second electrode contact portion, the memory cell may further comprise a fifth electrode, wherein the third MTJ layer stack is arranged between the fifth electrode and the SOT layer. The memory device may further comprise a fifth bitline, the fifth electrode being switchably connected to the fifth bitline.

The memory device may be configured such that:
when writing to the first MTJ layer stack, the fifth electrode may be configured to be disconnected from the fifth,
when writing to the second MTJ layer stack, the fifth electrode is configured to be disconnected from the fifth bitline; and
when writing to the third MTJ layer stack, the third and fourth electrode is configured to be disconnected from the third and fourth bitline, respectively, the fifth electrode is configured to be connected to the fifth bitline, and the first or second electrode is configured to be connected to the respective first or second bitline, such that a STT switching current is conducted between the fifth bitline and the first or second bitline.

The memory device may alternatively be configured such that:
when writing to the first MTJ layer stack, the fifth electrode is configured to be disconnected from the fifth bitline; and
when writing to the second and third MTJ layer stacks, the first, second and third electrode is configured to be disconnected from the first, second and third bitline, respectively, and the fourth and fifth electrode is configured to be connected to the fourth and fifth bitline, respectively, such that an STT switching current is conducted between the fourth and fifth bitline to write complementary logic states to the second and third MTJ layer stacks.

A differential STT-writing operation by means of a common STT-switching current passing sequentially through the second and third MTJ layer stacks may hence be provided.

According to a third aspect there is provided a method for writing to a memory cell, the memory cell comprising:
a first and a second electrode;
a spin-orbit-torque, SOT, layer comprising a first and a second electrode contact portion arranged in contact with the first and the second electrode, respectively, and an intermediate portion between the first and second electrode contact portions;
a first magnetic tunnel junction, MTJ, layer stack arranged in contact with the intermediate portion; and
a second MTJ layer stack arranged in contact with first or the second electrode contact portion; and the method comprising:
writing a logic state to the first MTJ layer stack by supplying an SOT switching current between the first and second electrodes and through the SOT layer such that a resistance state of the first MTJ layer stack is switched; and
writing a logic state to the second MTJ layer stack by supplying an STT switching current through the second MTJ layer stack such that a resistance state of the second MTJ layer stack is switched.

The discussion in connection with the first and second aspect and the embodiments and variations thereof is equally applicable to the method aspect.

The method may further comprise: reading a logic state from the first MTJ layer stack by sensing a resistance state of the first MTJ layer stack; and reading a logic state from the second MTJ layer stack by sensing a resistance state of the second MTJ layer stack.

According to embodiments the memory cell may be of, i.e. forms part of, a memory device. The memory device may comprise a first through fourth bitline, and the memory cell may further comprise a third and a fourth electrode, wherein the first MTJ layer stack is arranged between the third electrode and the SOT layer and the second MTJ layer stack is arranged between the fourth electrode and the SOT layer. The first electrode may be switchably connected to the first bitline, the second electrode may be switchably or fixedly connected to the second bitline, the third electrode may be switchably connected to the third bitline and the fourth electrode may be switchably connected to the fourth bitline.

When writing to the first MTJ layer stack, the fourth electrode may be disconnected from the fourth bitline, and the first and the second electrode may be connected to the first and second bitline, respectively, such that the SOT switching current is conducted between the first and second bitline.

When writing to the second MTJ layer stack, the third electrode may be disconnected from the third bitline, the fourth electrode may be connected to the fourth bitline, and the first or second electrode may be connected to the respective first or second bitline, such that the STT switching current is conducted between the fourth bitline and the first or second bitline.

In other words, the method may comprise, when writing to the first MTJ layer stack, disconnecting the fourth electrode from the fourth bitline, and connecting the first electrode to the first bitline (in case the second electrode is fixedly connected to the second bitline), or connecting the first electrode to the first bitline and the second electrode to the second bitline (in case the second electrode is switchably connected to the second bitline).

The method may comprise, when writing to the second MTJ layer stack, disconnecting the third electrode from the third bitline, connecting the fourth electrode to the fourth bitline, and disconnecting the first electrode from the first bitline (in case the second electrode is fixedly connected to the second bitline), or connecting one of the first electrode and the second electrode to the first and the second bitline, respectively (in case the second electrode is switchably connected to the second bitline).

When writing to the first MTJ layer stack, the third electrode may be connected to the third bitline, such that the SOT switching current conducted between the first and second bitline is supplemented by an STT switching current conducted between the third bitline and either of the first and second bitline.

When reading from the first MTJ layer stack, the third electrode may be connected to the third bitline and the first or second electrode may be connected to the respective first or second bitline, wherein the method may comprise sensing the resistance state of the first MTJ layer stack via the third bitline and the first or second bitline.

When reading from the second MTJ layer stack, the fourth electrode may be connected to the fourth bitline and the first or second electrode may be connected to the respective first or second bitline, wherein the method may comprise sensing the resistance state of the second MTJ layer stack via the fourth bitline and the first or second bitline.

The memory cell may further comprise:
a third MTJ layer stack arranged in contact with one of the first electrode contact portion and the second electrode contact portion, wherein the second MTJ layer stack is arranged in contact with the other one of the first or second electrode contact portion, and
a fifth electrode, wherein the third MTJ layer stack is arranged between the fifth electrode and the SOT layer.

The memory device may further comprise a fifth bitline, the fifth electrode being switchably connected to the fifth bitline, wherein
when writing to the first MTJ layer stack, the fifth electrode is disconnected from the fifth;

when writing to the second MTJ layer stack, the fifth electrode is disconnected from the fifth bitline; and
when writing to the third MTJ layer stack, the third and fourth electrode is disconnected from the third and fourth bitline, respectively, the fifth electrode is connected to the fifth bitline, and the first or second electrode is connected to the respective first or second bitline, such that a STT switching current is conducted between the fifth bitline and the first or second bitline.

Alternatively, the method may comprise simultaneously writing to the second and third MTJ layer stacks, comprising:
disconnecting the first, second and third electrode from the first, second and third bitline, respectively, and connecting the fourth and fifth electrode to the fourth and fifth bitline, respectively, such that an STT switching current is conducted between the fourth and fifth bitline. Thereby, an STT switching current may be conducted between the fourth and fifth bitline to write complementary logic states to the second and third MTJ layer stacks.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1A:
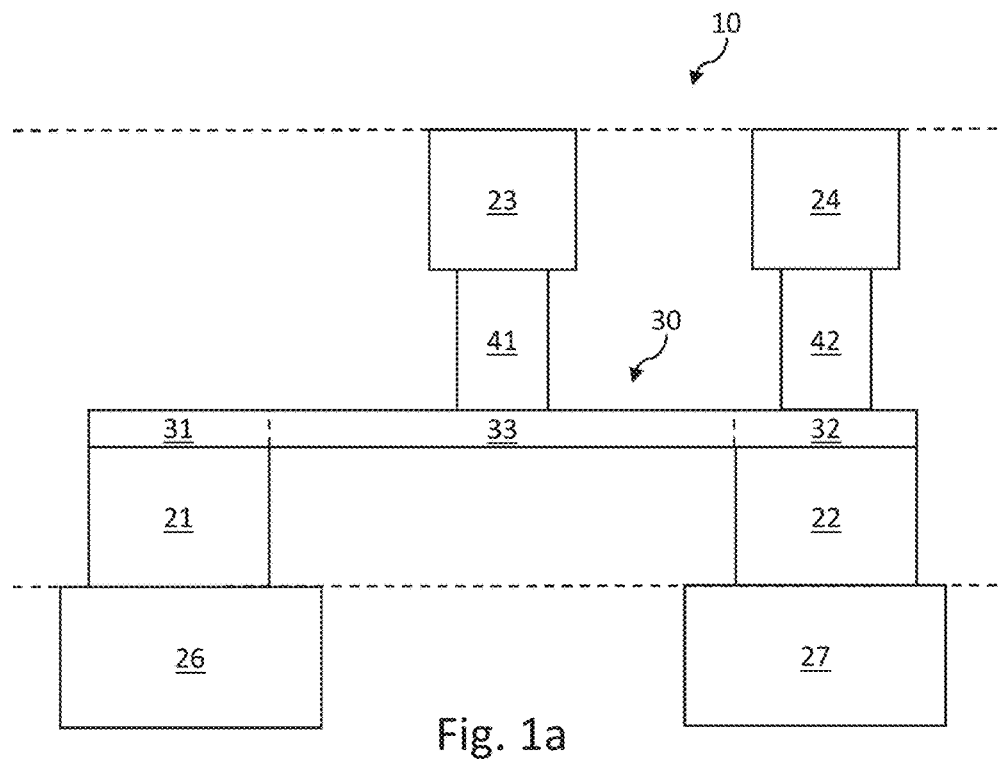
FIG. 1a is a schematic view of a memory cell according to an embodiment.

FIG. 1a is a schematic view of a memory cell 10. The memory cell 10 comprises a first electrode 21 and a second electrode 22. The memory cell 10 also comprises a spin-orbit-torque, SOT, layer 30 arranged over the first and second electrodes 21, 22. The dashed lines indicate different interconnection levels.

The SOT layer 30 comprises a first electrode contact portion 31 arranged in contact with the first electrode 21, a second electrode contact portion 32 arranged in contact with the second electrode 22 and an intermediate portion 33 between the first and second electrode contact portions 31, 32.

The memory cell 10 further comprises a first magnetic tunnel junction, MTJ, layer stack 41 arranged over the SOT layer 30 and in contact with the intermediate portion 33. The memory cell 10 furthermore comprises a second MTJ layer stack 42 arranged over the SOT layer 30 and in contact with the second electrode contact portion 32.

While the second MTJ layer stack 42 is shown to be arranged in contact with the second electrode contact portion 32, the second MTJ layer stack 42 may instead be arranged in contact with the first electrode contact portion 31 in all of the examples shown. This would in effect result in mirrored versions of FIGS. 1-2.

The first electrode 21 and second electrode 22 are arranged over a first contact 26 and a second contact 27, respectively, in a separate interconnection level. The first and second contacts 26, 27 allow for control circuitry to be connected to the memory cell 10 as will be further discussed in relation to FIG. 1b. The first and second contacts 26, 27 may be metal lines, for instance forming bitlines for the memory cell 10.

A third electrode 23 is arranged over the first MTJ layer structure 41 and a fourth electrode 24 is arranged over the first MTJ layer structure 42. The third and fourth electrodes 23, 24 allow for control circuitry to be connected to the memory cell 10 as will be further discussed in relation to FIG. 1b.

The first and second MTJ layer stacks 41, 42 each comprises a free layer 44, a reference layer 46 and a tunnel barrier layer 45 arranged between the free layer 44 and the reference layer 46. The magnetization direction of the reference layer 46 is pinned by a hard-magnetic pinning layer arranged above the reference layer 46, in other words the first and second MTJ layer stacks 41, 42 are top-pinned. The magnetization direction of the free layer 44 is switchable, which corresponds to switching a resistance state of the MTJ layer stack comprising the free layer 44.

The free layer 44 and the reference layer 46 of the first and second MTJ layer stacks 41, 42 may be formed from a ferromagnetic material, such as Fe, Co, FeB, CoB, CoFe, CoFeB, WCoFeB, TaCoFeB or combinations of these materials, to present a perpendicular magnetic anisotropy or an in-plane magnetic anisotropy.

The tunnel barrier layer 45 of the first and second MTJ layer stacks 41, 42 may be formed from a dielectric material, such as MgO, $AlO_x$, $MgAlO_x$, MgZnO, or $MgTiO_x$.

The pinning layer (not shown) of the first and second MTJ layer stacks 41, 42 may be formed from a material with high (magnetic) coercivity, such as a laminate (i.e. a "superlattice") of [Co/Pt], [Co/Pd] or [Co/Ni] bilayers, repeated a number of times, such as 4-8. Other possible compositions of the pinning layer include a Co-layer, an Fe-layer or a CoFe-layer or a laminate of a [Fe/X] or [CoFe/X], repeated a number of times, where X denotes Pt, Pd, Ni, Tb or Gd.

Figure 1B:
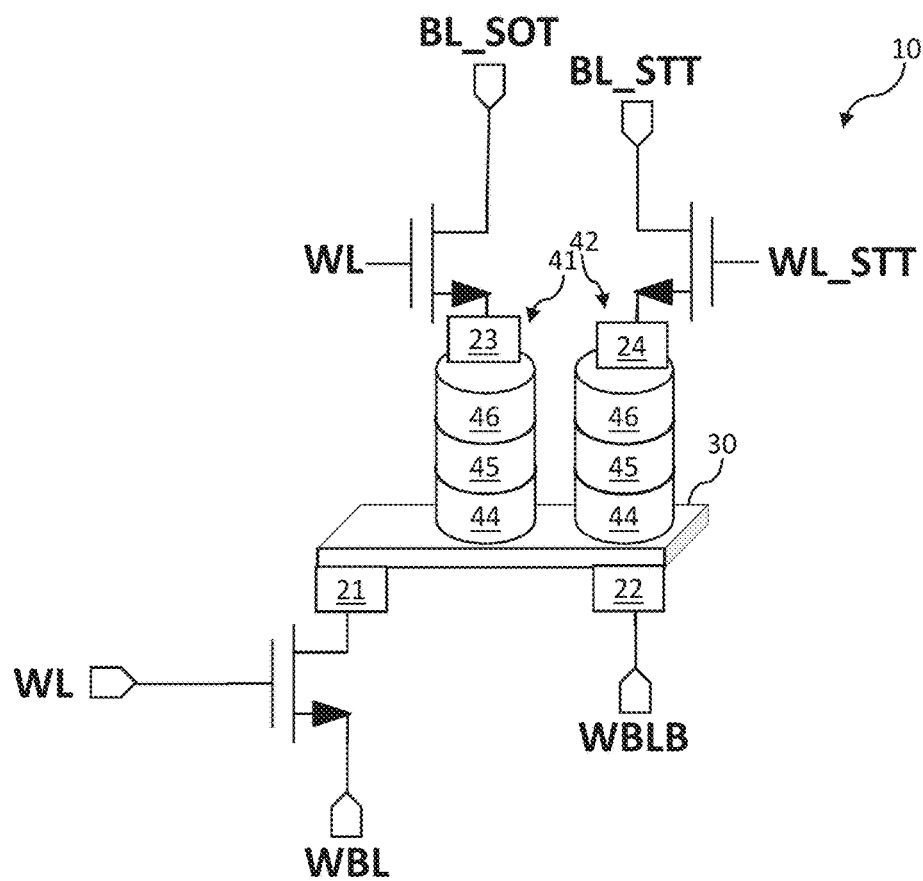
FIG. 1b is a schematic view of a memory cell and circuitry according to an embodiment.

Although FIG. 1b shows MTJ layer stacks with a single tunnel barrier configuration, the first and second MTJ layer stacks 41, 42 may also include a dual- or multi-tunnel barrier layer configuration. A dual- or multi-tunnel barrier layer configuration may include two or more stacks of free 44 and tunnel barrier layers 45.

The first and second MTJ layer stacks 41, 42 may further comprise a spacer layer between the SOT layer 30 and the free layer 44 that acts as a diffusion blocker. The spacer layer may comprise complex materials, such as a topological insulator, and may be formed by Ru, Ti, Hf, Mo, Mg, Al, W, Pt or Ta.

The the first and second MTJ layer stacks 41, 42 may be patterned into pillars, e.g. using ion beam etching, reactive ion etching or a combination of both.

As will be further described herein, the first MTJ layer stack 41 is configured to be switchable between two resistance states by applying an SOT switching current to the SOT layer 30, optionally supplemented by an STT switching current conducted through the first MTJ layer stack 41. The second MTJ layer stack 42 is configured to be switchable between two resistance states by conducting an STT switching current through the second MTJ layer stack 42.

FIG. 1b shows a memory cell 10 and circuitry of a memory device comprising the memory cell 10. The memory device comprises a first through fourth bitline (marked as WBL, WBLB, BL_SOT, BL_STT respectively in FIG. 1b). Each of the bitlines is switchably or fixedly connected to a respective first through fourth electrode 21-24. WBL and WBLB may for example correspond respectively to metal lines/bitlines 26 and 27 of FIG. 1a. The first electrode 21 may be switchably connected to WBL and the second electrode 22 is connected to WBLB. The third electrode 23 may be switchably connected to BL_SOT and the fourth electrode 24 may be switchably connected to BL_STT.

The memory device further comprises a plurality of switches arranged between the first, third and fourth electrodes and the first, third and fourth bitline, respectively, in order to switchably connect the electrodes to their respective bitline. These switches are shown as transistors in FIG. 1b and may e.g. be silicon field-effect transistors (Si-FET). In alternative embodiments, the memory device may also comprise a switch arranged between the second electrode and the second bitline and may use bidirectional selectors such as an ovonic threshold switch diode (OTS diode) or a metal-semiconductor-metal diode (MSM diode), as switches in addition to or instead of transistors.

The three switches of FIG. 1b are shown as being controlled by two separate wordlines, WL and WL_STT. A high logic level voltage VDD or a low logic level voltage VSS may be selectively applied to the wordlines, to connect or disconnect their respective associated electrode(s) to or from their respective bitline. The switches connected to the first 21 and third 23 electrodes are controlled in unison in the embodiment shown (i.e. via wordline WL), however other embodiments where these switches are separately controlled are also possible.

Accordingly, when writing to and reading from each MTJ layer stack 41, 42, the voltages of each bitline and each switch are controlled to direct an SOT switching current, an STT switching current and potentially a read current as requested. An example of such a control scheme is provided in Table I.

TABLE I

Control scheme example for FIG. 1b

|  | SOT | | STT | |
| --- | --- | --- | --- | --- |
|  | Write | Read | Write | Read |
| WL | VDD | VDD | VSS | VSS |
| WL_STT | VSS | VSS | VDD | VDD |
| WBL | VDD/VSS | VSS | Float | Float |
| WBLB | VSS/VDD | VSS | VSS/VDD | VSS/Vread |
| BL_SOT | Optional | Vread | Float | Float |
| BL_STT | Float | Float | VDD/VSS | Vread/VSS |

In the example of Table I and in the following, "VDD" means a high logic level voltage, "VSS" means a low logic level voltage. The terms high logic level voltage and low logic level voltage may hereby be understood as two voltage levels or states representing a binary one "1" and a binary zero "0", respectively. Furthermore in Table 1, "Vread" is a read voltage, "VSS/VDD," "VDD/VSS," "VSS/Vread" and "Vread/VSS" means that either voltage is possible and if one is chosen, all other choices in the same column adheres to the same side of the "/", "Float" means that the relevant bitline is not connected to their respective supply voltage and "Optional" means that the voltage applied may be VSS or VDD, or "Float", depending on the embodiment as will be further described below.

In the following disclosure, it is considered implicit that the actual levels of VSS and VDD are such that, when applied according to the example in Table I, they give rise to respective SOT- or STT-switching current densities exceeding the respective SOT- or STT-switching thresholds of the respective MTJ layer stacks 41, 42.

Moreover, although Table I indicates that the same respective high and low logic level voltages are applied to the respective terminals, it should be understood that in the following, different voltage levels may be applied to different terminals and during different operations.

According to the example of Table I, when writing to the first MTJ layer stack 41, the fourth electrode 24 is configured to be disconnected from the fourth bitline, and the first 21 and the second electrode 22 are configured to be connected to the first and second bitline, respectively. Thereby, one of the first 21 and the second electrode 22 is supplied with VDD and the other is supplied with VSS, which allows the SOT switching current to be conducted between the first and second bitline, via the SOT layer 70.

Further, because the first and third electrode/bitline connections are configured to be switchably connected in unison in this embodiment, when writing to the first MTJ layer stack 41, the third electrode 23 is connected to the third bitline at least because the first electrode 21 is connected to the first bitline.

The third bitline BL_SOT may optionally be provided with VSS or VDD. If VDD is applied to the third bitline, the SOT switching current conducted between the first WBL and second bitline WBLB is assisted by an STT assist current from the third bitline to the one of the first and second bitline that is supplied with VSS. Alternatively, if VSS is applied to the third bitline, the SOT switching current conducted between the first and second bitline is assisted by an STT assist current from the one of the first and second bitline that is supplied with VDD to the third bitline. If the third bitline voltage is floating, the SOT switching current conducted between the first and second bitline will not be assisted by an STT assist current.

Additionally, when writing to the second MTJ layer stack 42, the first 21 and third electrodes 23 are configured to be disconnected from the first and third bitline, respectively, and the fourth electrode 24 is configured to be connected to the fourth bitline. Furthermore, in the illustrated embodiment the second electrode 22 is configured to always be connected to the second bitline. Accordingly, one of the second 22 and the fourth 24 electrode may be supplied with VDD and the other with VSS, which allows the STT switching current to be conducted between the fourth bitline and the second bitline.

In an alternative embodiment, the first 21, second 22 and fourth 24 electrode are configured to be connected to the first, second and fourth bitline, respectively, such that either both the first 21 and second 22 electrodes or the fourth 24 electrode is supplied with VDD and the other electrode(s) is/are supplied with VSS, which allows the STT switching current to be conducted between the fourth bitline and both the first and second bitline.

A current may be conducted through the SOT layer 30 from the fourth bitline to the first bitline, however, this current may not have a high enough current density to cause SOT switching in the first MTJ layer stack 41. This is because the SOT switching threshold may be much higher than the STT switching threshold, e.g. by a factor of 10 or 100. Furthermore, despite possibly applying similar voltages to the respective bitlines as when writing to the first MTJ layer stack 41, the SOT threshold may only be reached in the case of conducting the current only through the SOT-layer 30 as a current loss may occur due to the resistance of the second MTJ layer stack 42.

According to the example of Table I, when reading from the first MTJ layer stack 41, the fourth electrode 24 is configured to be disconnected from the fourth bitline, the first 21 and third 23 electrode is configured to be connected to the first and third bitline, respectively (as they are configured to be switchably connected in unison in the embodiment of FIG. 1b), and the second electrode 22 is configured to always be connected to the second bitline in the embodiment of FIG. 1b.

In the embodiment of FIG. 1b, the third electrode 23 is supplied with a read voltage and the first 21 and second 22 electrode is supplied with VSS, which allows the memory device to sense the resistance state of the first MTJ layer stack 41, e.g. with a read current conducted between the third bitline and either or both of the first bitline and the second bitline. This may cause a transistor between the third bitline and third electrode 23 to be in source degeneration mode during reading, which may cause relatively slower reading speeds.

In an alternative example, the first electrode 21 and third electrode 23 are individually switchably controllable to be connected to their respective bitlines. In this case, the first bitline is floating, the third electrode 23 is supplied with VSS and the second electrode 22 is supplied with a read voltage. This which allows the memory device to sense the resistance state of the first MTJ layer stack 41, e.g. with a read current conducted between the third bitline and the second bitline. This may have a relatively fast reading speed compared to the embodiment of FIG. 1b but requires more advanced wordline connections.

Additionally, when reading from the second MTJ layer stack 42, the first 21 and third 23 electrode is configured to be disconnected from the first and third bitline, respectively. Further, the fourth electrode 24 is configured to be connected to the fourth bitline and in the illustrated embodiment, the second electrode 22 is configured to always be connected to the second bitline.

The fourth electrode 24 may be supplied with a read voltage and the second electrode may be supplied with VSS. This allows the memory device to sense the resistance state of the second MTJ layer stack 42. For example, by conducting a read current between the fourth bitline and the second bitline. A transistor between the third bitline and third electrode 23 may in this case operate a in source degeneration mode during reading. This may reduce a read speed.

Alternatively, the fourth electrode 24 may be supplied with VSS and the second electrode may be supplied with a read voltage. This allows the memory device to sense the resistance state of the second MTJ layer stack 42. For example, by a read current conducted between the fourth bitline and the second bitline. This may result in an increased read speed.

In order to write to the first MTJ layer stack 41, an SOT switching current is conducted between the first 21 and second 22 electrodes through the SOT layer 30. Accordingly, the first 21 and second 22 electrodes are separated to ensure that the SOT switching current runs along the SOT layer 30 past the first MTJ layer stack 41. Such a separation may lead to wasted space in the area above the first and second electrodes 21, 22.

By arranging a second MTJ layer stack 42 above the second electrode 22 according to this disclosure, this otherwise wasted space may be utilized. As this second MTJ layer stack 42 is arranged directly above an electrode, it may not be controlled using SOT switching, but may instead be configured to be controlled using STT switching.

In the above, an embodiment is disclosed with top-pinned MTJ layer stacks, the first and third electrode/bitline being controlled in unison and a second electrode 22 fixedly connected to the second bitline. A skilled person, being guided by the present disclosure, may realize that alternative embodiments are possible.

For example, the MTJ layer stacks may instead be bottom-pinned, which will also affect the control scheme. Also, the first 21, second 22 and third 23 electrode may be individually and switchably connected to the first, second and third bitline, respectively.

Figure 2A:
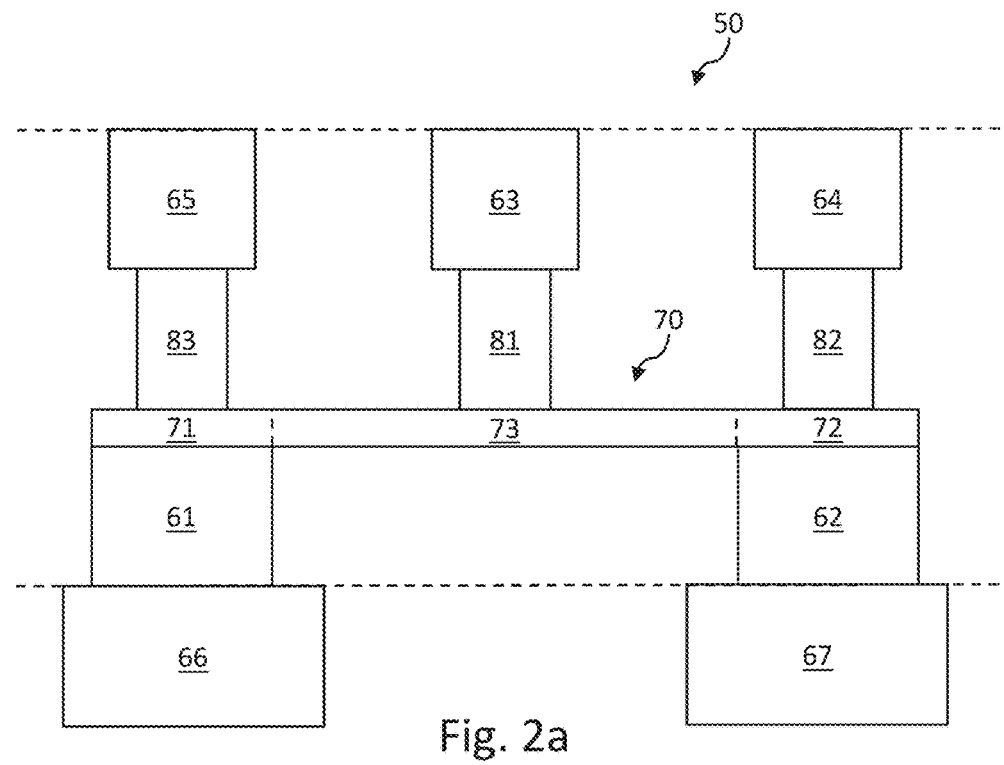
FIG. 2a is a schematic view of a memory cell according to an embodiment.

In order to further make efficient use of space to create an optimized memory cell 50, the memory cell 50 may further comprise a third MTJ layer stack 83 arranged in contact with the first electrode contact portion 71 of the SOT layer 70. FIG. 2*a* shows such a memory cell 50, wherein the dashed lines indicate different interconnection levels.

The third MTJ layer stack 83 is configured to be switchable between two resistance states by applying an STT switching current to the third MTJ layer stack 83.

A memory device comprising the memory cell 50 further comprises a fifth electrode 65, wherein the third MTJ layer stack 83 is arranged between the fifth electrode 65 and the first electrode contact portion 71; and a fifth bitline, the fifth electrode 65 being switchably connected to the fifth bitline.

Figure 2B:
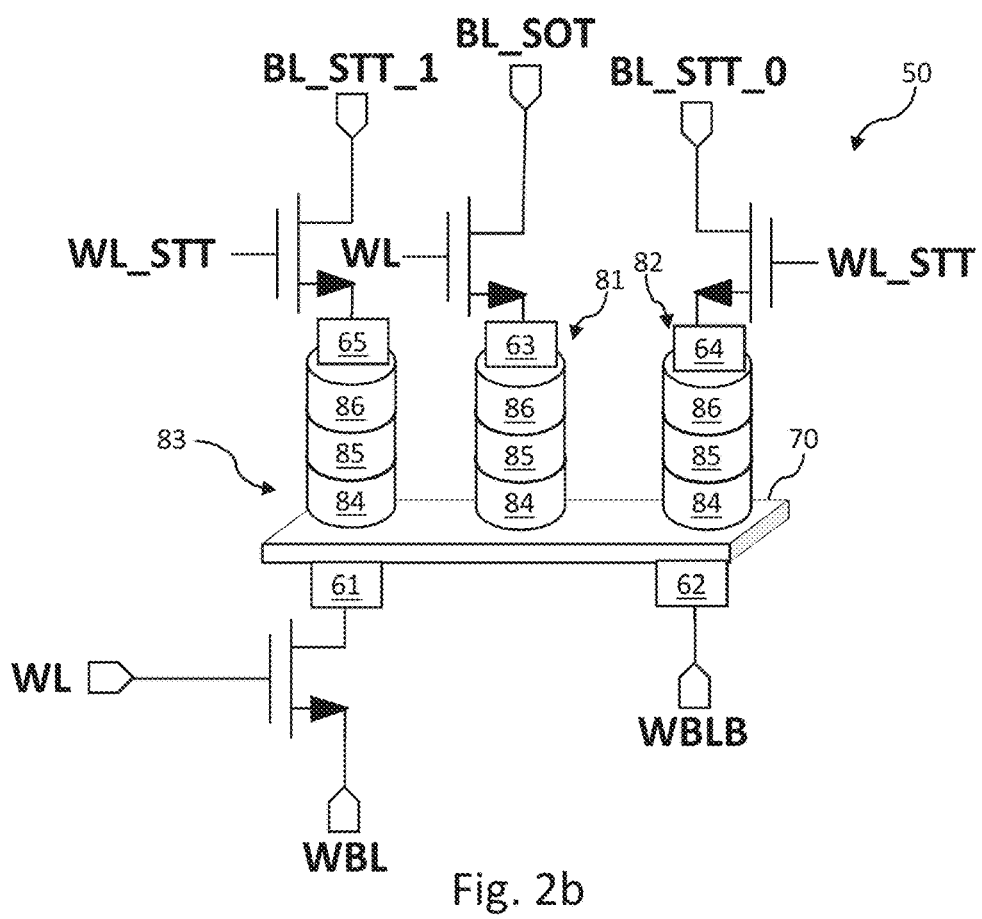
FIG. 2b is a schematic view of a memory cell and circuitry according to an embodiment.

FIG. 2*b* shows a memory cell 50 and circuitry of the memory device comprising the memory cell 50. The first through fifth bitlines are marked as WBL, WBLB, BL_SOT, BL_STT_1 and BL_STT_0 respectively in FIG. 2*b*. Each of the bitlines is switchably or fixedly connected to a respective first through fifth electrode 61-65. WBL and WBLB may for example correspond respectively to metal lines/bitlines 66 and 67 of FIG. 2*a*. The first electrode 61 may be switchably connected to WBL and the second electrode 62 is connected to WBLB. The third electrode 63 may be switchably connected to BL_SOT, the fourth electrode 64 may be switchably connected to BL_STT_0 and the fifth electrode 65 may be switchably connected to BL_STT_1.

The memory device further comprises a plurality of switches arranged between the first 61, third 63, fourth 64 and fifth 65 electrodes and the first, third, fourth and fifth bitline, respectively, in order to switchably connect the electrodes to their respective bitline. These switches are shown as transistors in FIG. 2*b* and may e.g. be Si-FET. In alternative embodiments, the memory device may also comprise a switch arranged between the second electrode 62 and the second bitline and may e.g. use OTS diodes or MSM diodes as switches in addition to or instead of transistors.

The four switches of FIG. 2*b* are shown as being controlled by two separate wordlines, WL and WL_STT. A high logic level voltage VDD or a low logic level voltage VSS may be selectively applied to the wordlines, to connect or disconnect their respective associated electrodes to or from their respective bitline. The switches connected to the first 61 and third 63 electrodes are controlled in unison (i.e. via wordline WL) and the switches connected to the fourth 64 and fifth 65 electrodes are controlled in unison (i.e. via wordline WL_STT) in the embodiment shown, however other embodiments where these electrodes are separately controlled are also possible.

TABLE II

| | Control scheme example for FIG. 2b | | | | | |
|---|---|---|---|---|---|---|
| | SOT | | STT (right) | | STT (both) | |
| | Write | Read | Write | Read | Write | Read |
| WL | VDD | VDD | VSS | VSS | VSS | VSS |
| WL_STT | VSS | VSS | VDD | VDD | VDD | VDD |
| WBL | VDD/VSS | VSS | Float | Float | Float | Float |
| WBLB | VSS/VDD | VSS | VSS/VDD | VSS | VSS/VDD | VSS |
| BL_SOT | Optional | Vread | Float | Float | Float | Float |
| BL_STT_0 | Float | Float | VDD/VSS | Vread | VDD/VSS | Vread |
| BL_STT_1 | Float | Float | Float | VSS | VDD/VSS | Vread |

In the example of Table II, the STT (right) columns relate to writing to and reading from the second MTJ layer stack 82. For controlling the third MTJ layer stack 83 instead, the controls of the BL_STT_0 and BL_STT_1 rows may be switched. The STT (both) columns relate to reading from and writing to both the second and third layer stacks 82, 83 at the same time.

According to the example of Table II, when writing to the second and third MTJ layer stack 82, 83, the first 61 and third 63 electrode is configured to be disconnected from the first and third bitline, respectively, the fourth 64 and fifth 65 electrode is configured to be connected to the fourth and fifth bitline, respectively. Furthermore, in the illustrated embodiment the second electrode 62 is configured to always be connected to the second bitline. Accordingly, the fourth 64 and fifth 65 electrode are supplied with VSS or VDD and the second electrode 62 is supplied with VDD or VSS, respectively, which allows an STT switching current to be conducted between the fourth bitline and the second bitline and between the fifth bitline and the second bitline.

According to the example of Table II, when reading from the second and third MTJ layer stacks 82, 83, the first 61 and third 63 electrode is configured to be disconnected from the first and third bitline, respectively, the fourth 64 and fifth 65 electrode is configured to be connected to the fourth and fifth bitline, respectively. Furthermore, in the illustrated embodiment the second electrode 62 is configured to always be connected to the second bitline Accordingly, the fourth 64 and fifth 65 electrode are supplied with a read voltage and the second electrode 62 is supplied with VSS, which allows the memory device to sense the resistance state of the second and third MTJ layer stack 82, 83. For example, with a read current conducted between the fourth and the second bitline and between the fifth bitline and the second bitline.

This may cause the transistor between the fourth and fifth bitline and the fourth 64 and fifth 65 electrode to be in source degeneration mode during reading, which in turn may reduce read speed.

According to an example, the fourth electrode 64 and fifth electrode 65 are individually switchably controllable to be connected to their respective bitlines. Thereby, when reading from the second and third MTJ layer stacks 82, 83, the first 61 and third 63 electrode are configured to be disconnected from the first and third bitline, respectively, and the fourth 64 or fifth 65 electrode is configured to be connected to the fourth or fifth bitline, respectively. In the illustrated embodiment, the second electrode 62 is configured to always be connected to the second bitline. Accordingly, the fourth 64 or fifth 65 electrode is supplied with VSS and the second electrode is supplied with a read voltage, which allows the memory device to sense the resistance state of the second and third MTJ layer stack 82, 83. For example with a read current conducted between the fourth and the second bitline and between the fifth bitline and the second bitline.

This may avoid causing the transistor between the fourth and fifth bitline and the fourth 64 and fifth 65 electrode to be in source degeneration mode during reading, which may increase read speed, but requires more advanced wordline connections.

TABLE III

Differential control scheme example

| | STT (diff) | |
|---|---|---|
| | Write | Read |
| WL | VSS | VSS |
| WL_STT | VDD | VDD |
| WBL | Float | Float |
| WBLB | Float | VSS |
| BL_SOT | Float | Float |
| BL_STT_0 | VDD/VSS | Vread |
| BL_STT_1 | VSS/VDD | Vread |

In the example of Table III, the STT (diff) columns relate to writing complementary logic states to and reading from the second and third MTJ layer stacks 82, 83. In this embodiment, the memory device comprises a switch arranged between the second electrode 62 and the second bitline, which disconnects the second electrode 62 from the second bitline during the writing operation.

According to the example of Table III, when writing complementary logic states to the both second and third MTJ layer stack 82, 83 at once, the first 61, second 62 and third 63 electrode is configured to be disconnected from the first, second and third bitline, respectively. Further, the fourth 64 and fifth 65 electrode is configured to be connected to the fourth and fifth bitline, respectively, such that one of the fourth and fifth electrode is supplied with VSS and the other of the fourth 64 and fifth 65 electrode is supplied with VDD. This allows an STT switching current to be conducted between the fourth and fifth bitline through the SOT-layer 70. As a result, the STT switching current is conducted in different directions through each of the second and third MTJ layer stack 82, 83, which causes the free layer 84 of each of the second and third MTJ layer stack 82, 83 to have different resistance states.

VSS and VDD may be chosen such that, when applied according to the example in Table III, they give rise to STT switching current densities exceeding the STT switching thresholds of the respective second and third MTJ layer stacks 82, 83 without giving rise to an SOT switching current density exceeding the SOT switching threshold of the first MTJ layer stack 81 as the current is conducted through the SOT-layer 70. This may be achieved as the SOT switching threshold may be much higher than the STT switching threshold, e.g. by a factor of 10 or 100. Furthermore, a current loss may occur due to the resistance of the second and/or third MTJ layer stack 82, 83.

According to the example of Table III, when reading from the second and third MTJ layer stacks 82, 83, the same control scheme may be used as when reading from both states as in Table II. Furthermore, if it is known that each of the second and third MTJ layer stacks 82, 83, store complementary resistance states, only one of the states need to be read in order to know both states.

Figure 3:
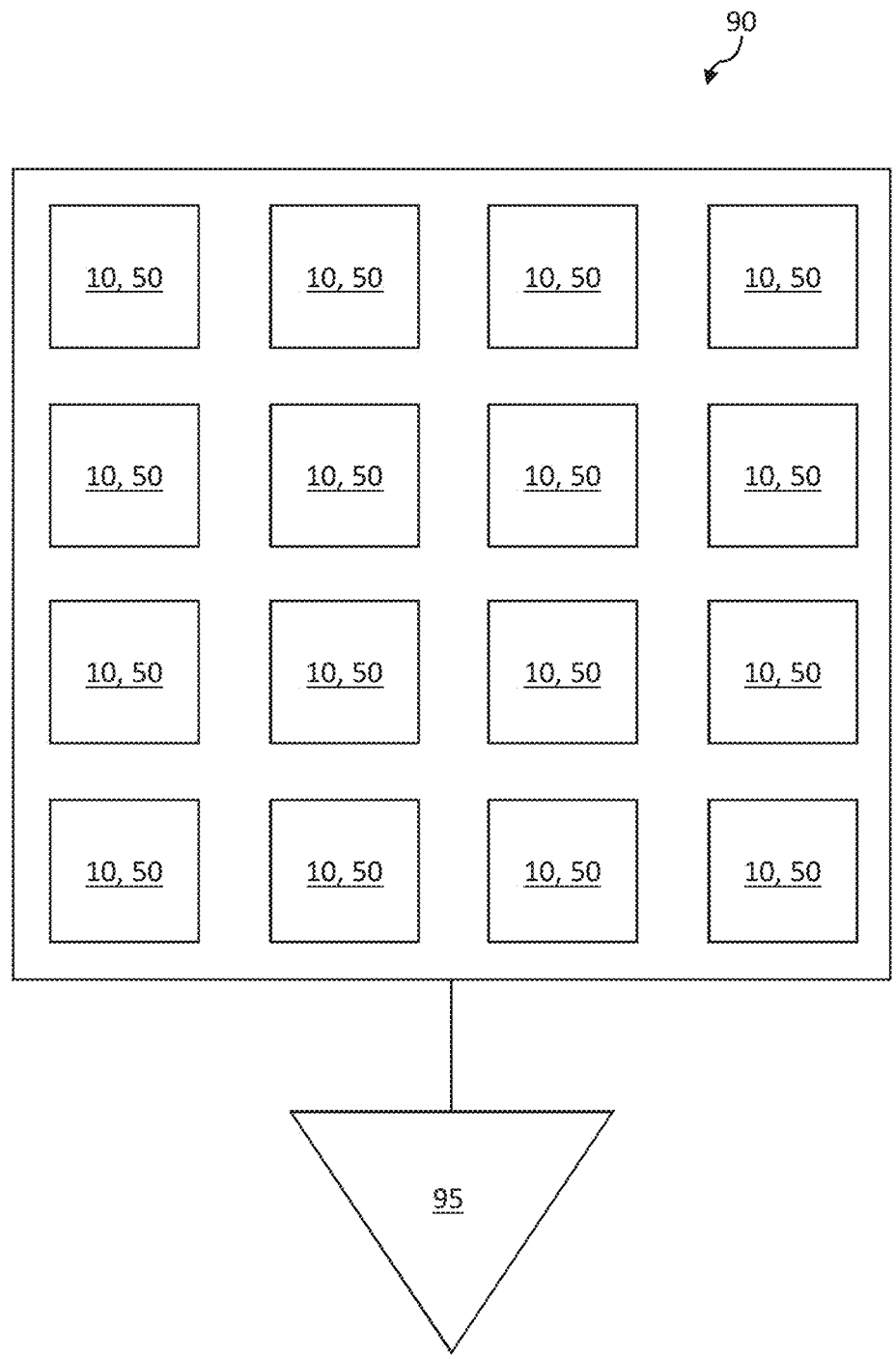
FIG. 3 is a schematic view of a memory device according to an embodiment.

FIG. 3 shows a memory device 90 comprising a plurality of memory cells 10, 50 as previously disclosed. The memory device 90 is configured to write a logic state to the first MTJ layer stack of a memory cell 10, 50 by supplying an SOT switching current between the first and second electrodes and through the SOT layer such that a resistance state of the first MTJ layer stack is switched. The memory device 90 is further configured to write a logic state to the second and/or third MTJ layer stack of a memory cell 10, 50 by supplying an STT switching current through the second and/or third MTJ layer stack such that a resistance state of the second and/or third MTJ layer stack is switched.

The memory device 90 is also configured to read a logic state from the first MTJ layer stack of a memory cell 10, 50 by sensing a resistance state of the first MTJ layer stack; and read a logic state from the second and/or third MTJ layer stack of a memory cell 10, 50 by sensing a resistance state of the second and/or third MTJ layer stack.

The memory device 90 comprises circuitry 95 such as vias, bitlines and write lines to control the writing to and reading from each memory cell 10, 50 of the plurality of memory cells 10, 50.

The circuitry 95 of the memory device 90 further comprises a plurality of switches arranged between any number of electrodes of memory cells 10, 50 and their respective bitline to switchably connect the electrodes to their respective bitline, wherein the electrodes and bitlines are arranged on separate interconnection layers of the memory device 90.

By forming a memory device 90 comprising a plurality of memory cells 10, 50 according to this disclosure, a high density of both SOT-MTJ memory cells and STT-MTJ memory cells may be achieved.

An SOT-MTJ memory cell may enable faster writing operations than STT-MTJs. On the other hand, an STT-MTJ memory cell may allow for higher memory densities than SOT-MTJs, due to the increased footprint of the SOT-layer relative to the MTJ layer stack. SOT-MTJ memory cells may therefore conventionally be used for short-term low-capacity memory devices such as TAG-RAM while STT-MTJ memory cells may conventionally be used for long-term high-capacity memory devices such as disc drives.

A combination memory device 90 according to this disclosure may therefore have the speed of SOT-MTJ memory cells while also having a high memory density as usually associated with STT-MTJ memory cells. Such a memory device 90 may be used for a larger variety of different memory structures that may be used more efficiently.

Figure 4:
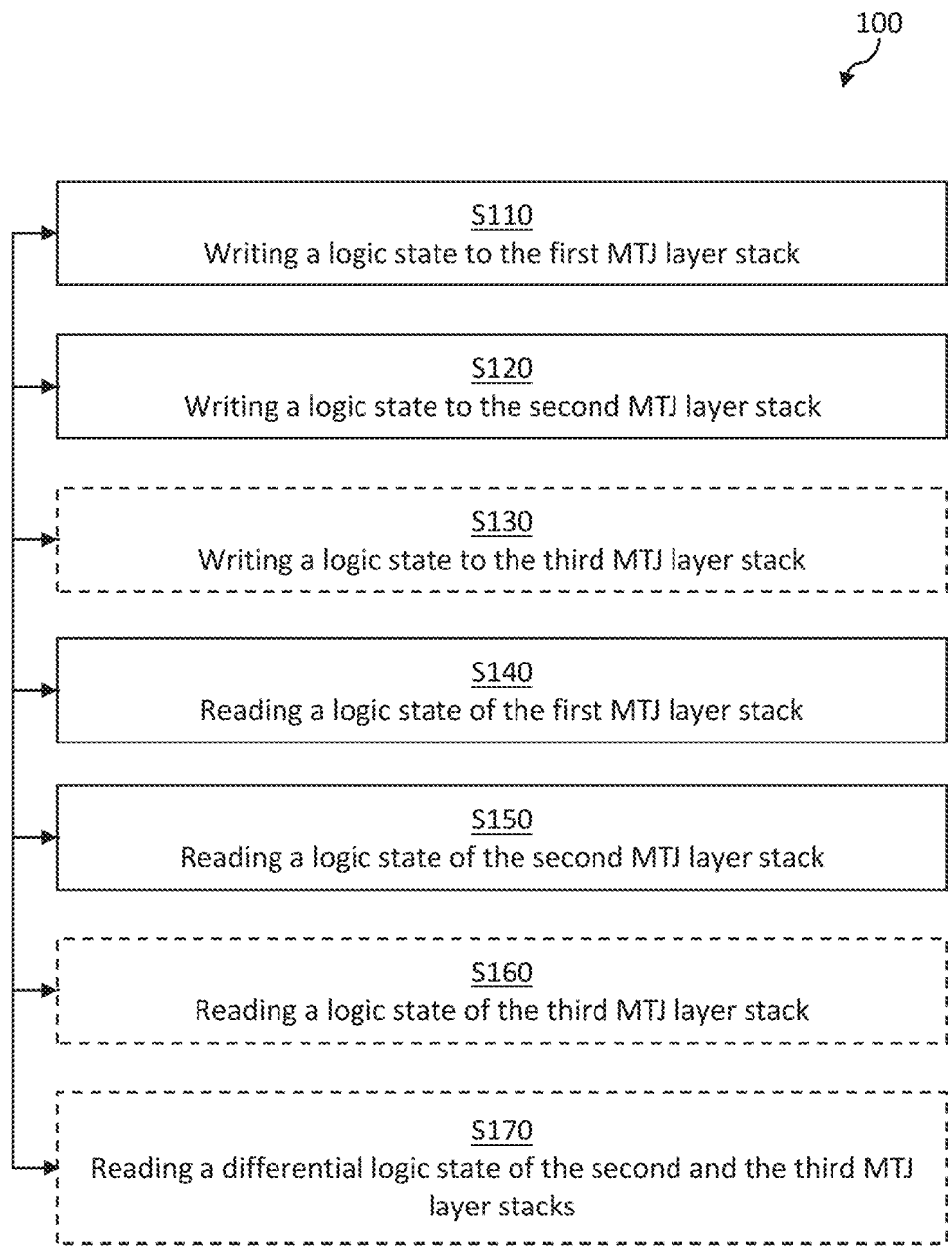
FIG. 4 is a flowchart of a method for writing to a memory cell.

FIG. 4 shows a method 100 for writing to and reading from a memory cell of a memory device according to this disclosure. The method 100 comprises a number of steps S110-S170 that may be performed in any order. The steps of FIG. 4 marked with dashed lines are optional.

A step of writing S110 a logic state to a first MTJ layer stack of the memory cell comprises supplying an SOT switching current between a first and a second electrode of the memory cell and through the SOT layer of the memory cell such that a resistance state of the first MTJ layer stack is switched.

When writing S110 to the first MTJ layer stack, a fourth electrode of the memory cell is disconnected from a fourth bitline of the memory device, and a first and a second electrode of the memory cell are connected to a first and a second bitline, respectively, of the memory device such that the SOT switching current is conducted between the first and second bitline.

This step S110 may further comprise connecting a third electrode of the memory cell to a third bitline of the memory device, such that the SOT switching current conducted between the first and second bitline is assisted by an STT assist current between the third bitline and either of the first and second bitline.

A step of writing S120 a logic state to a second MTJ layer stack of the memory cell comprises supplying an STT switching current through the second MTJ layer stack such that a resistance state of the second MTJ layer stack is switched.

When writing S120 to the second MTJ layer stack, the third electrode may be disconnected from the third bitline, the fourth electrode is connected to the fourth bitline, and one or both of the first and the second electrodes is connected to the respective first or second bitline, such that the STT switching current is conducted between the fourth bitline and said respective first or second bitline.

A step of writing S130 a logic state to a third MTJ layer stack of the memory cell comprises supplying an STT switching current through the third MTJ layer stack such that a resistance state of the third MTJ layer stack is switched.

When writing S130 to the third MTJ layer stack, the third and fourth electrode may be disconnected from the third and fourth bitline, a fifth electrode of the memory cell is connected to a fifth bitline of the memory device, and one or both of the first and the second electrodes is connected to the respective first or second bitline, such that the STT switching current is conducted between the fifth bitline and said respective first or second bitline.

A step of reading S140 a logic state from the first MTJ layer stack comprises supplying a reading current through or a reading voltage over the first MTJ layer stack to sense the resistance state of the first MTJ layer stack.

When reading S140 from the first MTJ layer stack, the third electrode is connected to the third bitline and one of the first and second electrodes is connected to the respective first or second bitline such that a resistance state of the first MTJ layer stack may be sensed via the third bitline and said one of the first and second bitlines.

A step of reading S150 a logic state from the second MTJ layer stack comprises supplying a reading current through or a reading voltage over the second MTJ layer stack to sense the resistance state of the second MTJ layer stack.

When reading S150 from the second MTJ layer stack, the fourth electrode is connected to the fourth bitline and one of the first and second electrodes is connected to the respective first or second bitline such that a resistance state of the second MTJ layer stack may be sensed via the fourth bitline and said one of the first and second bitlines.

A step of reading S160 a logic state from the third MTJ layer stack comprises supplying a reading current through or a reading voltage over the third MTJ layer stack to sense the resistance state of the third MTJ layer stack.

When reading S160 from the third MTJ layer stack, the fifth electrode is connected to the fifth bitline and one of the first and second electrodes is connected to the respective first or second bitline such that a resistance state of the third MTJ layer stack may be sensed via the fifth bitline and said one of the first and second bitlines.

A step of reading S170 a differential logic state from the second and third MTJ layer stacks comprises supplying a reading current through or a reading voltage over both the second and third MTJ layer stacks to sense the resistance state of both the second and third MTJ layer stacks.

When reading S170 from both the second and third MTJ layer stacks at once, the fourth and fifth electrode is connected to the fourth and fifth bitline, respectively, and one of the first and second electrodes is connected to the respective first or second bitline such that a resistance state of both the second and third MTJ layer stacks may be sensed via the fourth and fifth bitline and said one of the first and second bitlines.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A memory device comprising:
   a memory cell comprising:
      a first and a second electrode;
      a spin-orbit-torque, SOT, layer comprising a first and a second electrode contact portion arranged in contact with the first and the second electrode, respectively, and an intermediate portion between the first and second electrode contact portions;
      a first magnetic tunnel junction, MTJ, layer stack arranged in contact with the intermediate portion; and
      a second MTJ layer stack arranged in contact with the second electrode contact portion and directly above the second electrode,
   the memory device being configured to:
      write a logic state to the first MTJ layer stack by supplying an SOT switching current between the first and second electrodes and through the SOT layer such that a resistance state of the first MTJ layer stack is switched; and
      write a logic state to the second MTJ layer stack by supplying an STT switching current through the second MTJ layer stack such that a resistance state of the second MTJ layer stack is switched.

2. The memory device according to claim 1, wherein the memory device is configured to:
   read a logic state from the first MTJ layer stack by sensing a resistance state of the first MTJ layer stack; and
   read a logic state from the second MTJ layer stack by sensing a resistance state of the second MTJ layer stack.

3. The memory device according to claim 1, further comprising first through fourth bitlines, and the memory cell further comprising a third electrode and a fourth electrode, wherein the first MTJ layer stack is arranged between the third electrode and the SOT layer and the second MTJ layer stack is arranged between the fourth electrode and the SOT layer,
   wherein the first electrode is switchably connected to the first bitline, the second electrode is switchably or fixedly connected to the second bitline, the third electrode is switchably connected to the third bitline and the fourth electrode is switchably connected to the fourth bitline, and wherein:

when writing to the first MTJ layer stack, the fourth electrode is configured to be disconnected from the fourth bitline, and the first electrode and the second electrode are configured to be connected to the first and second bitlines, respectively, such that the SOT switching current is conducted between the first and second bitlines; and when writing to the second MTJ layer stack, the third electrode is configured to be disconnected from the third bitline, the fourth electrode is configured to be connected to the fourth bitline, and the first or second electrode is configured to be connected to the respective first or second bitline, such that the STT switching current is conducted between the fourth bitline and the first or second bitline.

4. The memory device according to claim 3, wherein, when reading from the first MTJ layer stack, the third electrode is configured to be connected to the third bitline and the first or second electrode is configured to be connected to the respective first or second bitline, wherein the memory device is configured to sense the resistance state of the first MTJ layer stack via the third bitline and the first or second bitline; and when reading from the second MTJ layer stack, the fourth electrode is configured to be connected to the fourth bitline and the first or second electrode is configured to be connected to the respective first or second bitline, wherein the memory device is configured to sense the resistance state of the second MTJ layer stack via the fourth bitline and the first or second bitline.

5. The memory device according to claim 3, wherein the memory cell further comprises:

a third MTJ layer stack arranged in contact with the first electrode contact portion and directly above the first electrode, and a fifth electrode, wherein the third MTJ layer stack is arranged between the fifth electrode and the SOT layer; and the memory device further comprising a fifth bitline, the fifth electrode being switchably connected to the fifth bitline, wherein when writing to the first MTJ layer stack, the fifth electrode is configured to be disconnected from the fifth bitline;

when writing to the second MTJ layer stack, the fifth electrode is configured to be disconnected from the fifth bitline; and when writing to the third MTJ layer stack, the third and fourth electrodes are configured to be disconnected from the third and fourth bitlines, respectively, the fifth electrode is configured to be connected to the fifth bitline, and the first or second electrode is configured to be connected to the respective first or second bitline, such that the STT switching current is conducted between the fifth bitline and the first or second bitline.

6. The memory device according to claim 3, wherein the memory cell further comprises:

a third MTJ layer stack arranged in contact with the first electrode contact portion and directly above the first electrode, and a fifth electrode, wherein the third MTJ layer stack is arranged between the fifth electrode and the SOT layer;

the memory device further comprising a fifth bitline, the fifth electrode being switchably connected to the fifth bitline, wherein when writing to the first MTJ layer stack, the fifth electrode is configured to be disconnected from the fifth bitline; and when writing to the second and third MTJ layer stacks, the first, second and third electrodes are configured to be disconnected from the first, second and third bitlines, respectively, and the fourth and fifth electrodes are configured to be connected to the fourth and fifth bitlines, respectively, such that the STT switching current is conducted between the fourth and fifth bitlines to write complementary logic states to the second and third MTJ layer stacks.

7. A method for writing to a memory cell, the memory cell comprising:

a first electrode and a second electrode;

a spin-orbit-torque, SOT, layer comprising a first electrode contact portion and a second electrode contact portion arranged in contact with the first electrode and the second electrode, respectively, and an intermediate portion between the first and second electrode contact portions;

a first magnetic tunnel junction, MTJ, layer stack arranged in contact with the intermediate portion; and a second MTJ layer stack arranged in contact with the second electrode contact portion and directly above the second electrode; and the method comprising:

writing a logic state to the first MTJ layer stack by supplying an SOT switching current between the first and second electrodes and through the SOT layer such that a resistance state of the first MTJ layer stack is switched; and writing a logic state to the second MTJ layer stack by supplying a spin-transfer-torque, STT, switching current through the second MTJ layer stack such that a resistance state of the second MTJ layer stack is switched.

8. The method according to claim 7, wherein the memory cell is of a memory device, the memory device comprising first through fourth bitlines, and the memory cell further comprising a third electrode and a fourth electrode, wherein the first MTJ layer stack is arranged between the third electrode and the SOT layer and the second MTJ layer stack is arranged between the fourth electrode and the SOT layer, wherein the first electrode is switchably connected to the first bitline, the second electrode is switchably or fixedly connected to the second bitline, the third electrode is switchably connected to the third bitline and the fourth electrode is switchably connected to the fourth bitline, and wherein:

when writing to the first MTJ layer stack, the fourth electrode is disconnected from the fourth bitline, and the first electrode and the second electrode are connected to the first bitline and the second bitline, respectively, such that the SOT switching current is conducted between the first and second bitline; and when writing to the second MTJ layer stack, the third electrode is disconnected from the third bitline, the fourth electrode is connected to the fourth bitline, and the first or second electrode is connected to the respective first or second bitline, such that the STT switching current is conducted between the fourth bitline and the first or second bitline.

9. The method according to claim 8, wherein, when writing to the first MTJ layer stack, the third electrode is connected to the third bitline, such that the SOT switching current conducted between the first and second bitlines is supplemented by the STT switching current conducted between the third bitline and either of the first and second bitlines.

10. The method according to claim 8 or 9, wherein,
when reading from the first MTJ layer stack, the third electrode is connected to the third bitline and the first or second electrode is connected to the respective first or second bitline, and the method comprises sensing the resistance state of the first MTJ layer stack via the third bitline and the first or second bitline; and when reading from the second MTJ layer stack, the fourth electrode is connected to the fourth bitline and the first or second electrode is connected to the respective first or second bitline, and the method comprises sensing the resistance state of the second MTJ layer stack via the fourth bitline and the first or second bitline.

\* \* \* \* \*